United States Patent
Hosoya et al.

(10) Patent No.: US 8,853,628 B2
(45) Date of Patent: Oct. 7, 2014

(54) DEFECT INSPECTION METHOD, AND DEVICE THEREOF

(75) Inventors: Naoki Hosoya, Tokyo (JP); Toshifumi Honda, Yokohama (JP); Takashi Hiroi, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 45 days.

(21) Appl. No.: 13/697,025

(22) PCT Filed: Apr. 5, 2011

(86) PCT No.: PCT/JP2011/058593
§ 371 (c)(1), (2), (4) Date: Feb. 1, 2013

(87) PCT Pub. No.: WO2011/142196
PCT Pub. Date: Nov. 17, 2011

(65) Prior Publication Data
US 2013/0119250 A1    May 16, 2013

(30) Foreign Application Priority Data
May 13, 2010 (JP) .................................. 2010-111126

(51) Int. Cl.
*H01J 37/28* (2006.01)
*G06T 7/00* (2006.01)
*H01J 37/22* (2006.01)
*H01L 21/66* (2006.01)

(52) U.S. Cl.
CPC ................. *H01J 37/28* (2013.01); *G06T 7/001* (2013.01); *H01J 37/222* (2013.01); *H01L 22/12* (2013.01); *G06T 2207/30148* (2013.01); *G06T 2207/10061* (2013.01); *G06T 2207/20148* (2013.01)

USPC ............ 250/307; 250/306; 250/310; 250/311

(58) Field of Classification Search
USPC ................... 250/306, 307, 310, 311; 430/296
See application file for complete search history.

(56) References Cited

U.S. PATENT DOCUMENTS

| | | | |
|---|---|---|---|
| 7,424,146 B2 * | 9/2008 | Honda et al. ................. | 382/149 |
| 2001/0033683 A1 | 10/2001 | Tanaka et al. | |
| 2002/0114506 A1 | 8/2002 | Hiroi et al. | |

(Continued)

FOREIGN PATENT DOCUMENTS

| | | |
|---|---|---|
| JP | 2001-304842 | 10/2001 |
| JP | 2003-6614 | 1/2003 |

(Continued)

OTHER PUBLICATIONS

Office Action in corresponding Japanese Application No. 2010-111126, mailed Mar. 11, 2014.

*Primary Examiner* — Nicole Ippolito
(74) *Attorney, Agent, or Firm* — Antonelli, Terry, Stout & Kraus, LLP.

(57) ABSTRACT

A conventional pattern inspection, which compares an image to be inspected with a reference image and subjects the resulting difference value to the defect detection using the threshold of defect determination, has difficulty in highly-sensitive inspection. Because defects occur only in specific circuit pattern sections, false reports occur in the conventional pattern inspections which are not based on the position. Disclosed are a defect inspection method and a device thereof which perform a pattern inspection by acquiring a GP image in advance, designating a place to be inspected and a threshold map to the GP image on the GUI, setting the identification reference of the defects, next acquiring the image to be inspected, applying the identification reference to the image to be inspected, and identifying the defects with the identification reference, thereby enabling the highly-sensitive inspection.

10 Claims, 11 Drawing Sheets

(56) References Cited

U.S. PATENT DOCUMENTS

| | | |
|---|---|---|
| 2005/0152594 A1 | 7/2005 | Jau et al. |
| 2007/0031025 A1* | 2/2007 | Lim et al. ............... 382/149 |
| 2008/0099676 A1 | 5/2008 | Sasajima et al. |
| 2009/0208090 A1* | 8/2009 | Nishiura et al. ......... 382/149 |
| 2011/0163230 A1 | 7/2011 | Hiroi et al. |

FOREIGN PATENT DOCUMENTS

| | | |
|---|---|---|
| JP | 2005-150727 | 6/2005 |
| JP | 2008-112690 | 5/2008 |
| WO | WO 2010/029700 | 3/2010 |
| WO | WO 2010/029700 A1 | 3/2010 |

* cited by examiner

DEFECT INSPECTION METHOD, AND DEVICE THEREOF

TECHNICAL FIELD

The present invention relates to techniques for inspecting semiconductor wafers, and more particularly to a defect inspection method and related device suitable for inspecting defects on patterns formed on a semiconductor wafer.

BACKGROUND ART

With finer structuring of the circuit patterns formed on semiconductor wafers, defects that occur in their manufacturing processes are causing increasingly significant effects to product yields, and it is becoming more and more important to control the manufacturing processes so that no such defects arise during the manufacturing phase. Currently at semiconductor wafer-manufacturing sites, defect inspection devices are generally used to improve yields. In mass-production lines for semiconductor manufacture, it is necessary to properly monitor an occurring state of defects during the manufacturing processes. This requires inspecting wafers as many as possible using a defect inspection device.

Defect inspection devices use optical means or an electron beam to represent a state of a wafer surface in the form of an image and automatically process this image for rapid identification of defect positions on the wafer. In such a defect inspection device, since the rapidness of the identification is crucial, a pixel size of the images acquired is maximized, that is, resolution is minimized, to reduce the amount of image data to be acquired. In many cases, even when existence of defect candidates can be confirmed from a detected image of such low resolution, the defect candidates are difficult to discriminate in detail from defects that are to be actually detected.

Prior art relating to functions and the like of such a defect inspection device is disclosed in JP-A-2003-6614 (Patent Document 1). Patent Document 1 describes the configuration, defect inspection function, and operational sequence of the defect inspection device.

In addition, a method of fixed-point inspection is available to detect defects by first acquiring one pixel value for each of a plurality of images acquired by sequentially imaging predefined regions-of-interest of dies during electron beam scanning with a scanning electron microscope (SEM), and then comparing this pixel data with defect discrimination threshold levels. Prior art associated with such method is disclosed in JPA-2005-150727 (Patent Document 2).

PRIOR ART LITERATURE

Patent Documents

Patent Document 1: JP-A-2003-6614
Patent Document 2: JP-A-2005-150727

SUMMARY OF THE INVENTION

Problems to be Solved by the Invention

Among the kinds of defects that a user wishes to detect during semiconductor inspection are electrical defects such as an in-wafer contact hole continuity defect in the step of forming plugs. This defect is difficult to detect with an optical type of inspection device. With a SEM, however, irradiating the wafer surface with an electron beam enables the detection of that electrical defect, since a voltage contrast image is obtained that exhibits a difference in brightness between a properly conducting plug and an improperly conducting plug.

Meanwhile, the difference in the brightness of the SEM image may also be caused by factors other than improper electrical continuity. For example, these factors include foreign matter present on the wafer surface, slight current leakage, noise, and other defects that the user does not wish to detect. A defect that the user wishes to detect, and a defect that the user does not wish to detect, both appear as SEM images different from each other in brightness, so the two defects are both extracted as defect candidates in the prior-art defect inspection devices, in which case, it is also difficult to discriminate whether the defect is that which the user wishes to detect.

Means for Solving the Problems

The inspection of the circuit patterns formed on a semiconductor wafer is commonly performed by imaging the wafer with a scanning electron microscope (SEM), and after processing the obtained images, detecting defects present on the circuit patterns. During SEM imaging, a deflected electron beam is scanned across the semiconductor wafer and then detectors acquire secondary electrons and/or electron reflections, both emanated from the wafer, and convert these electrons into image form. A plurality of dies are cyclically arranged in grid form on the wafer and the same circuit pattern is formed on each of the dies, so that after one of corresponding regions of each die has been extracted as an image for inspection, this image is compared with a reference image of another corresponding region and defects are detected from comparison results. In addition, a plurality of memory cells are cyclically arranged in grid form on an internal memory mat region of the die and the same circuit pattern is formed on each of the memory cells, so that the memory cells are likewise compared with one another and inspected.

In order to attain the above object, the present invention provides, as an aspect thereof, an inspection method and inspection device for conducting a Golden Pattern (GP) inspection, in which a SEM image that has been obtained during SEM imaging of a memory mat beforehand is stored into storage means as a teaching image for the GP inspection, then another SEM image obtained during the SEM imaging of the memory mat is extracted as an image to be inspected, and the stored GP image and the image to be inspected are compared for defect detection.

In order to attain the above object, the present invention provides, as another aspect thereof, a method for inspecting defects on a sample surface using an image acquired with a scanning electron microscope (SEM) beforehand, in which method, first the SEM-acquired image is used to create a GP image and set up defect discrimination criteria on a screen, then the SEM is used to acquire an image to be inspected, and the defect discrimination criteria that has been set on the screen is used to conduct a comparative inspection between the GP image and the image to be inspected, and to output results of the comparative inspection.

In order to attain the above object, the present invention provides, as yet another aspect thereof, a defect inspection device that includes: scanning electron microscope (SEM) unit which acquires an image of a sample by imaging the sample; display unit which displays the image of the sample that has been acquired using the SEM unit; GP image creating unit which creates a GP image from the image of the sample that the display unit has displayed; defect discrimination criteria setting unit which sets, on the display unit displaying the GP image created by the GP image creating unit, criteria for discriminating defects on the sample image acquired using the SEM unit; defect detection unit which detects defects on the sample by implementing, by use of the defect discrimination criteria set up using the defect discrimination criteria setting unit, a comparative inspection of the image acquired during the imaging of the sample using the SEM unit, with respect to the GP image created by the GP image creating unit; and output unit which transmits results of the sample defect detection with the defect detection unit.

Effects of the Invention

In accordance with the present invention, of all defects that the user wishes to detect and all those which the user does not wish to detect, only the defects that the user wishes to detect are detected and inspected with high sensitivity by GP inspection.

MODES FOR CARRYING OUT THE INVENTION

Hereunder, embodiments of the present invention will be described referring to the accompanying drawings.

First Embodiment

Figure 1:
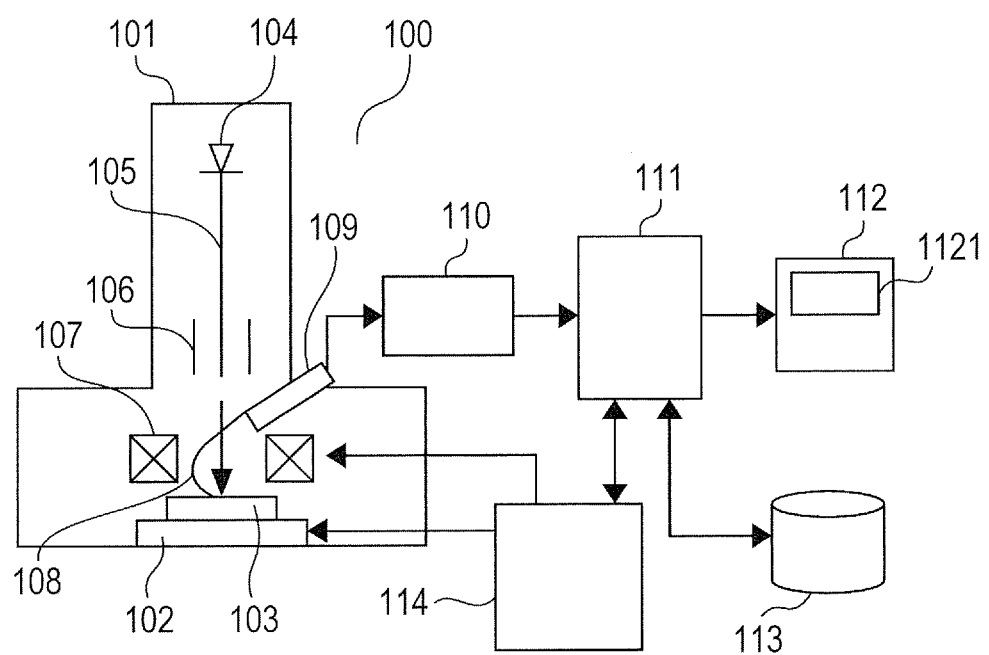
FIG. 1 is a block diagram showing a schematic configuration of an inspection device in a first embodiment.

An embodiment that applies the present invention to an inspection device is described below. An example of a configuration of the inspection device according to the present embodiment is shown in FIG. 1. This inspection device acquires images of a semiconductor wafer by imaging it with a scanning electron microscope, then implements image processing in an image-processing circuit, and discriminates defects present on the wafer.

The inspection device comprises a scanning electron microscope (SEM) 100, an A/D converter 110, image-processing means 111, a user interface unit 112, storage means 113, and a total device controller 114.

The scanning electron microscope (SEM) 100 includes a casing 101, a table 102 movable inside the casing 101, an electron beam source 104 that emits an electron beam 105, a deflector 106 for deflecting the electron beam 105 that has been emitted from the electron beam source 104, electron lenses 107 that control a focus position of the electron beam 105, and a detector 109 that detects secondary electrons 108 emanated from a semiconductor wafer 103 scanned by the emitted electron beam 105 whose focus position has been controlled by the electron lenses 107, the detection being synchronized with a deflection signal from the deflector 106. The secondary electrons that the detector 109 has detected are each converted into an electrical signal and then after being further converted into a digital image signal by the A/D converter 110, sent to the image-processing means 111, in which the digital image signal is then subjected to image processing.

When the semiconductor wafer 103, a sample, is imaged using the SEM type of semiconductor wafer inspection device configured as described above, first the electron beam 105, emitted from the electron beam source 104, is repeatedly deflected at a fixed period in a direction of X by the deflector 106. Next, the electron beam 105 is converged by the electron lenses 107 and focused on the surface of the semiconductor wafer 103 moving at a fixed rate in a direction of Y by an action of the stage 102. The focused electron beam is then scanned across the wafer surface in synchronization with the movement of the beam in the Y-direction by the action of the stage 102. In this way, the secondary electrons 108 (including reflected beam), emanated from the semiconductor wafer 103 thus scanned by the emitted electron beam 105, are each detected by the detector 109 and converted into a digital signal by the A/D converter 110. After this, an image to be inspected (hereinafter referred to as inspection data) is created from the digital signal, and the image-processing means 111 conducts image processing to compare the inspection image with a previously stored GP image, extract any differences between the two images, and detect defects.

Figure 2:
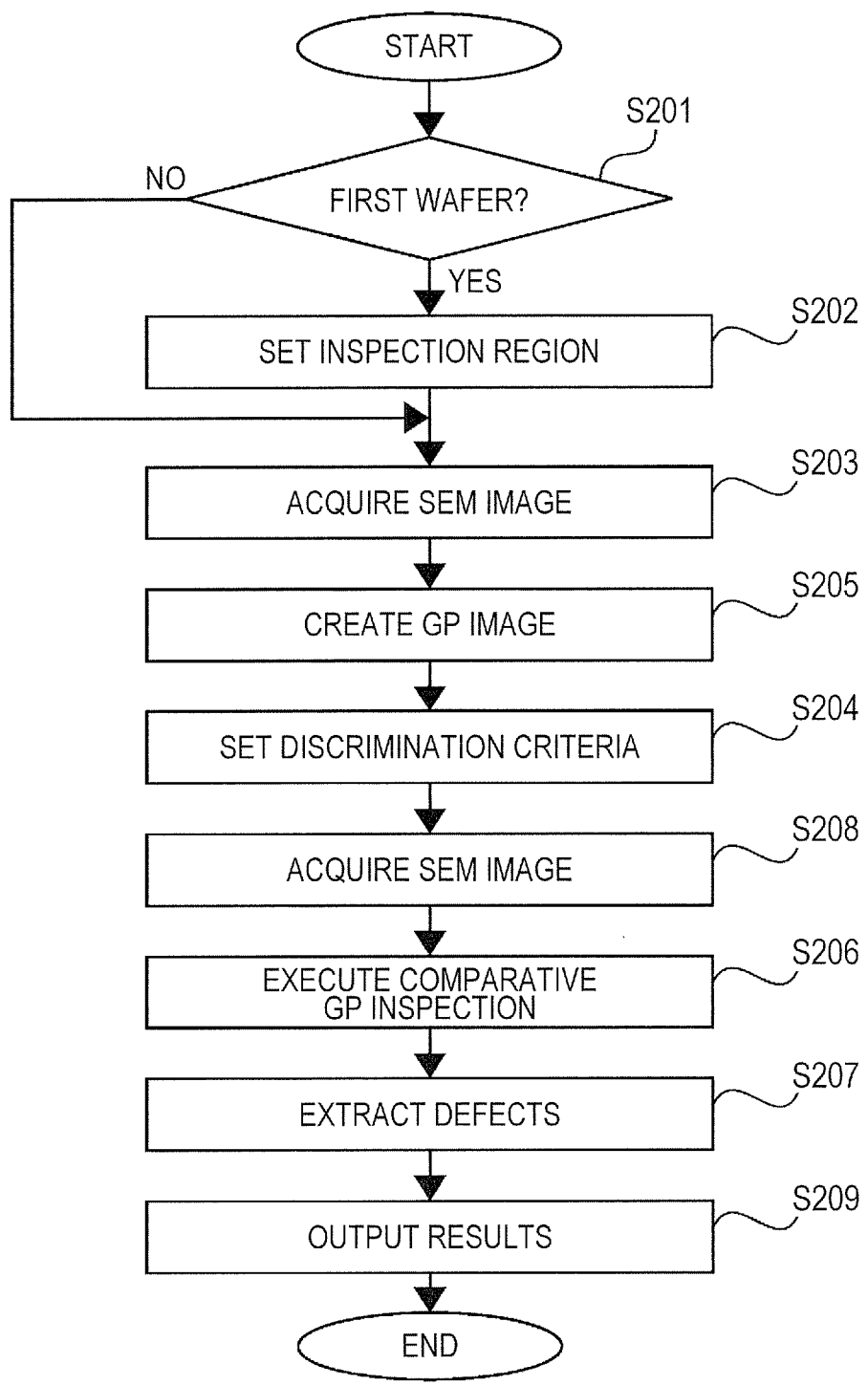
FIG. 2 is a flow chart that shows an operational sequence relating to GP inspection in the first embodiment.

FIG. 2 shows an example of an operational sequence for conducting a GP inspection using the above inspection device to detect defects by taking an image of the memory cells formed on the semiconductor wafer 103, as the inspection image, and comparing this inspection image with a GP image.

First, whether the wafer is the first one to be inspected is determined (step S201) and in a case of YES, that is, if the wafer is the first to be inspected, of all circuit patterns present on the wafer to be inspected, only a region including the memory cells is specified from the user interface unit 112 (step S202). Next, a SEM image of the specified region on the wafer to be inspected is acquired by imaging the specified region using the SEM 100, and the SEM image is stored with position information into the storage means 113 (step S203). The SEM image, stored in the storage means 113 after being acquired in step S203, is next used to create a GP image in the image-processing means 111 (step S205). After this, criteria for discriminating defects during the GP inspection is set up (step S204). Next, regions on the wafer to be inspected that each include a pattern of the same shape as that of the specified region are sequentially imaged using the SEM 100 to acquire a plurality of SEM images, and the acquired SEM images are stored with position information into the storage means 113 (step S208). Next, the image processing means 111 uses the defect discrimination criteria to conduct sequential comparative GP inspections between the GP image and each of the SEM images stored in the storage means 113, and detect defect candidates (step S206). After this, the image-processing means 111 extracts defects from the detected defect candidates (step S207), and then outputs processing results (step S209).

The wafer that went through SEM image acquisition step S208 is unloaded from the SEM-type inspection device during the execution of steps S206-S209 by the image-processing means 111 and the storage means 113, and then a wafer to be next inspected is loaded into the inspection device. The wafer that has been loaded for the next inspection is, in step S201, determined not to be the first wafer, and after the determination, SEM image acquisition step S208 is immediately executed. Thus, SEM images are acquired using the information relating to the region which was specified in step S202, and the SEM images are each stored into the storage means 113. The sequence next proceeds to GP inspection step S206, in which step, the GP inspection is then executed using the GP image that was created using the first wafer, and steps S207 to S209 follow in that order.

The process flow in which steps S202 to S205 in FIG. 2 are skipped for the second and subsequent wafers has been described above. However, determination step S201 may also be deleted and SEM images of each of the second and subsequent wafers may be used in step S205 to create respective independent GP images.

In SEM image acquisition steps S203 and S208, noise due to, for example, circuit noise developed in the circuit of the electron optics, occurs in each SEM image acquired from the wafer (this noise in the SEM image is hereinafter referred to simply as the noise). Since the occurrence state of the noise differs between the inspection image and the reference image, this difference is detected as a false defect during the comparison between the inspection image and the reference image. To suppress the detection of the false defect, it is necessitated to reduce defect detection sensitivity, and as a result, real defects might be overlooked. To suppress the detection of the false defect and prevent real defects from being overlooked, therefore, it is necessary to reduce the noise occurring in the image. As the semiconductor process nodes becomes finer, the need for detection of even smaller defects increases, which is, in turn, increasing the necessity for the reduction of the noise occurring in the image.

For reduced image noise in the present invention, the inspection device may use a plurality of memory cell images to create an average image by calculating an average from the memory cell images, and use this average image as a GP image to reduce the noise developed in the GP image.

Figure 3:
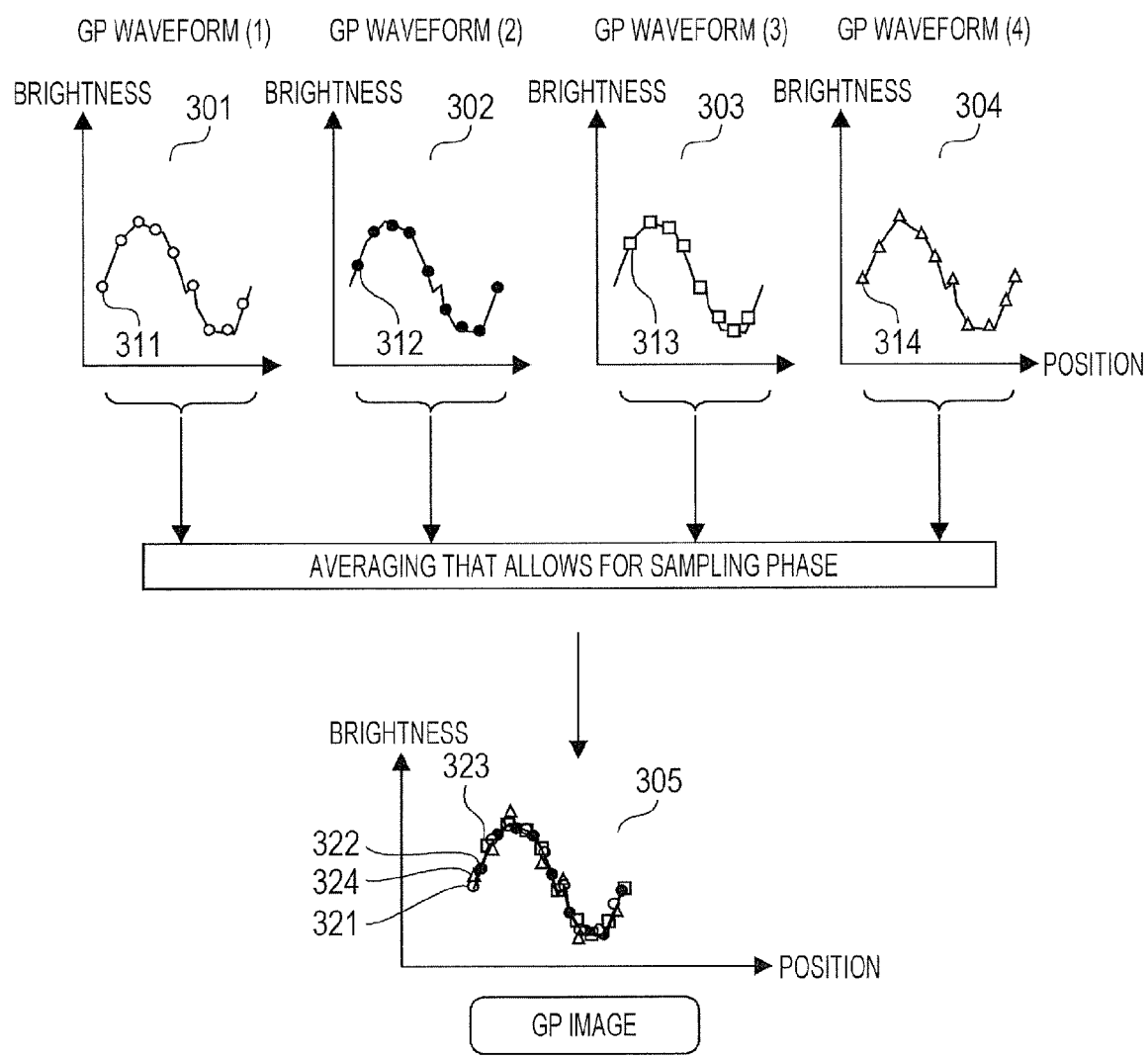
FIG. 3 is a diagram showing an example of a concept of GP image averaging in the first embodiment.

An example of a concept of GP image averaging is shown in FIG. 3. One-dimensional waveforms are used herein for simplicity of description. GP waveform (1) 301, GP waveform (2) 302, GP waveform (3) 303, and GP waveform (4) 304 are image signals of the individual memory cells originally formed to be of the same shape, and each is therefore basically the same waveform. Although each waveform is sampled on an image size basis and converted into a digital image, since shifts in phase exist between the waveforms, there are also shifts in sampling position between the waveforms. In averaging GP image, therefore, the GP images are combined into one GP waveform considering the shifts in phase. For example, if sampling point (1) 311, sampling point (2) 1312, sampling point (3) 313, and sampling point (4) 314 are present at a left end of each reference image and these waveforms are to be combined into one GP waveform 1305, it is desirable to create an average image by positioning each of the sampling points to combining position (1) 321, combining position (2) 322, combining position (3) 323, and combining position (4) 324, for allowing the shifts in phase.

Although a GP image has been created from the memory cell images in the above description, if the object to be inspected is a logic block of the semiconductor wafer, the GP image may instead be created from images of non-cyclic circuit patterns. Even in non-cyclic circuit patterns, the same circuit patterns are present in the same places on each die of the wafer to be inspected. Another alternative method useable to create a GP image, therefore, is by using the same circuit patterns formed on the wafer, in which case, these circuit patterns may be useable to create an average image by calculating an average from the circuit pattern images, and use this average image as a GP image to reduce the noise developed in the GP image.

While in the above-described embodiment, the average image has been created from the acquired plurality of SEM images and used as the GP image, it can be applied to extract one image from an acquired plurality of SEM images and the extracted image may be used as the GP image. For example, after evaluating the acquired plurality of SEM images in terms of pattern edge sharpness and/or pattern width, the image closest to an ideal pattern (design pattern) may be selected from the evaluated SEM images and used as the GP image.

First Modification

Figure 4:
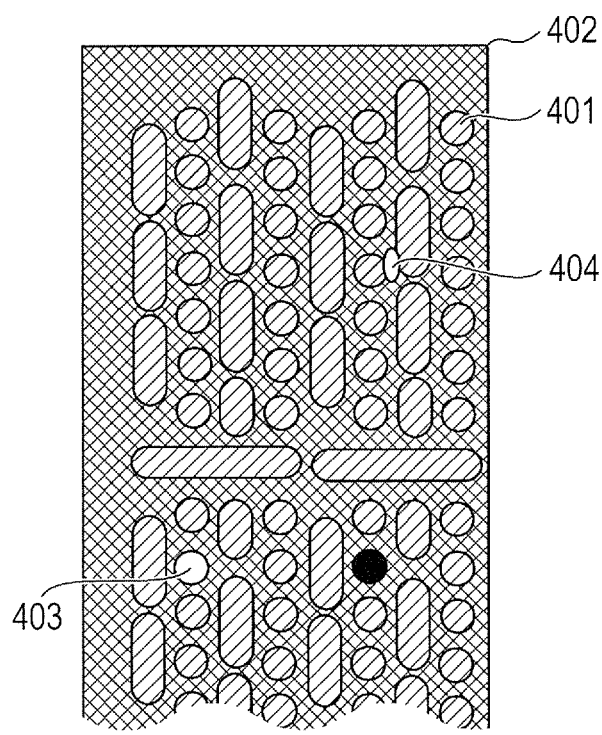
FIG. 4 is a diagram that represents a SEM image, showing an example of a circuit pattern to be inspected in the first embodiment.

While one of the SEM images obtained by imaging the memory cell region is used as the GP image in the above embodiment, the defects that a user wants to detect may occur only in a specific circuit pattern section of the memory cell region. If this is the case, noise that the user does not want to detect is likely to be detected as a defect candidate, if the inspection image and the reference image are compared as they are. For example, in a case of a circuit pattern 402 with a hole array 401, as in FIG. 4, a defect 403 that the user wants to detect would be a difference of brightness inside a hole on the SEM image, and not a difference of brightness between one hole and another which is a defect 404 due to the noise. In this case, if the inspection image and the reference image are compared as they are, the noise is likely to be detected as a defect candidate.

In a first modification of the present invention, therefore, only a particular region may be inspected by specifying this region with respect to the teaching image. This will suppress the detection of noise as a defect candidate.

A total process flow in the first modification of the present invention is the same as the process flow shown in FIG. 2, but details of a process in discrimination criteria setting step S204 differ from that of the first embodiment.

Figure 5:
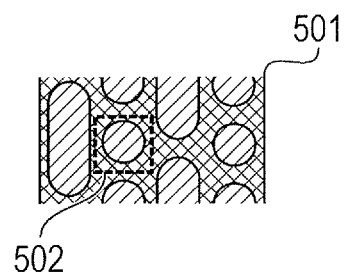
FIG. 5 is a diagram that represents a SEM image, showing an example of a concept of discrimination criteria setting in the first embodiment.

The concept of discrimination criteria setting according to the first modification is shown in FIG. 5. A region to be inspected, or an inspection region, is specified on a SEM image 501 that has been obtained by imaging the wafer. For example, the obtained SEM image is displayed on a GUI screen 1121 of the user interface unit 112. The user next specifies the inspection region 502, for example, in boxed form, that is, in the form of a rectangular frame, on the SEM image that the user interface unit 112 displays on the GUI screen 1121. Since the inspection region is displayed, the user can confirm whether the inspection region is appropriate. Where a plurality of memory cells having the same pattern shape are present on the SEM image, the inspection region is set on each memory cell in the form of a rectangular frame automatically. Only this region will be inspected in GP inspection step S206.

Second Modification

In the first modification, the difference in the brightness of the inspection region has been set as a defect that the user wants to detect. The inspection region, if brighter (whiter) than the other regions on the SEM image, is displayed as a defect that the user would wish to detect. If the inspection region is darker (blacker), however, it may be a noise that the user would not want to detect. In that case, if the inspection image and the reference image are compared as they are, the noise is likely to be detected as a defect candidate.

In a second modification, therefore, detection threshold levels for white defects, and those of black defects may be specified independently of each other. This will suppress the detection of noise as a defect candidate.

A total process flow in the second modification of the present invention is the same as the above process flow shown in FIG. 2, but details of the process in discrimination criteria setting step S204 differ from that of the first embodiment.

Figure 6:
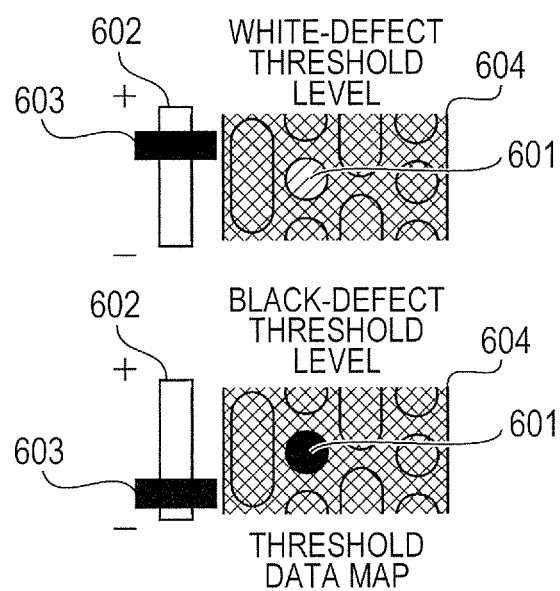
FIG. 6 is a diagram that represents a SEM image, showing another example of a concept of discrimination criteria setting in the first embodiment.

The concept of discrimination criteria setting according to the second modification is shown in FIG. 6. For example, independent adjusting gauges 602 for specifying the white-defect detection threshold and black-defect detection threshold levels for a designated inspection region 601 are displayed on the GUI screen 1121 of the user interface unit 112. Next, the user moves the gauges to the respective threshold levels 603 to be specified. Threshold data maps 604 of the specified white and black threshold levels corresponding to the SEM image are then displayed on the GUI screen 1121. When the threshold data maps 604 based on the user specification are displayed, the user will be able to confirm whether the threshold levels are appropriate.

Third Modification

While the above modification has assumed a memory mat constructed of a succession of memory cells having the same pattern shape, the memory mat may include irregular patterns different from the memory cell patterns. In that case, if the inspection image and the reference image are compared as they are, the irregular patterns are likely to be detected as a defect candidate.

In a third modification, therefore, the irregular pattern region may be specified on the SEM image as a region to be excluded from inspection. This will suppress the detection of the irregular patterns as a defect candidate.

A total process flow in the third modification of the present invention is the same as the above process flow shown in FIG. 2, but details of the process in discrimination criteria setting step S204 differs from that of the first embodiment.

Figure 7:
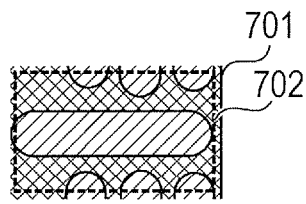
FIG. 7 is a diagram that represents a SEM image, showing yet another example of a concept of discrimination criteria setting in the first embodiment.

A concept of discrimination criteria setting according to the third modification is shown in FIG. 7. The user specifies the irregular pattern region on a SEM image obtained by imaging the wafer. For example, the obtained SEM image 701 is displayed on the GUI screen 1121 of the user interface unit 112. The user next specifies the irregular pattern region 702, for example, in boxed form, that is, in the form of a rectangular frame, on the SEM image that the user interface unit 112 displays on the GUI screen 1121. When the irregular pattern region is displayed, the user will be able to confirm whether the irregular pattern region is appropriate. Where a plurality of irregular pattern regions having the same pattern shape are present on the SEM image, the rectangle mentioned above is set on each irregular pattern automatically. These irregular patterns will be excluded from the inspection in GP inspection step S206.

Fourth Modification

It has been described in the above that the region where the defect that the user wants to detect occurs is clear on the SEM image. However, as if a pattern is displayed similarly to a real pattern in appearance on the SEM image, as with a shape of a dummy pattern, since the particular pattern does not operate as an electrical circuit, a defect candidate that occurs with the dummy pattern may not be critical. If the pattern is inspected as it is, a defect is likely to be detected at the dummy pattern.

In the fourth modification, therefore, only a region of interest may be inspected by specifying it referring to design information. This will suppress the detection of the dummy pattern as a defect candidate.

A total process flow in the fourth modification of the present invention is the same as the above process flow shown in FIG. 2, but details of the process in discrimination criteria setting step S204 differs from that of the first embodiment.

Figure 8:
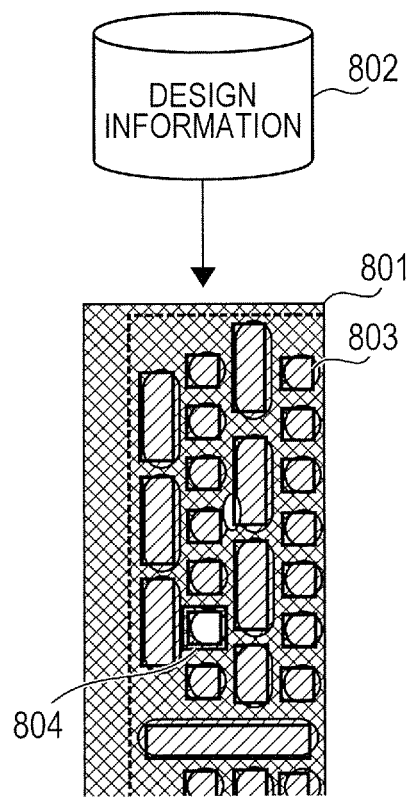
FIG. 8 is a diagram that represents a SEM image, showing a further example of a concept of discrimination criteria setting in the first embodiment.

The concept of discrimination criteria setting according to the fourth modification is shown in FIG. 8. The user specifies the region of interest on a SEM image obtained by imaging the wafer. For example, the obtained SEM image is displayed on the GUI screen 1121 of the user interface unit 112. In addition, design information 802 corresponding to the SEM image 801 is displayed in overlapped form on the SEM image. This state is shown as 803 in the figure. For example, the user next specifies the region of interest, 804, in boxed form, that is, in the form of a rectangular frame, on the SEM image. When the region of interest is displayed, the user will be able to confirm whether the region of interest is appropriate. The region of interest will be inspected in GP inspection step S206.

Fifth Modification

Even if whether the region of interest is defective can be determined, there is a case that a difference appears on the SEM image is not clear. If this is the case, the inspection region would be specified ambiguously and direct inspection of the region is likely to result in noise being detected as a defect candidate, or in a real defect being overlooked.

In the fifth modification, therefore, the user may teach on the GP image whether the region of interest is normal or defective, and use this information to specify the inspection region. This will suppress detecting noise as a defect candidate, or missing a real defect.

A total process flow in the fifth modification of the present invention is the same as the above process flow shown in FIG. 2, but details of the process in discrimination criteria setting step S204 differs from that of the first embodiment.

Figure 9:
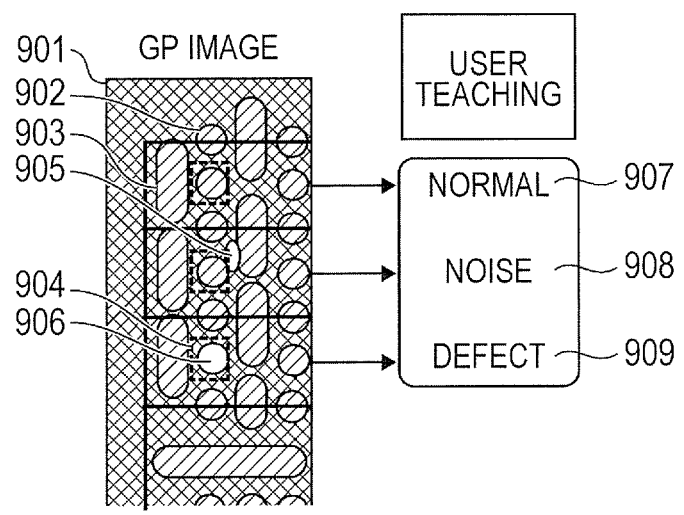
FIG. 9 is a block diagram that includes an illustrated SEM image, showing a further example of a concept of discrimination criteria setting in the first embodiment.

The concept of discrimination criteria setting according to the fifth modification is shown in FIG. 9. For example, an obtained SEM image 901 is displayed on the GUI screen 1121 of the user interface unit 112. On the SEM image 901 displayed on the GUI screen 1121, the user teaches whether the region of interest is normal or contains noise or defects. Next, the user specifies the inspection region on the SEM image 901. The inspection region 903 is automatically set in rectangular form on memory cells 902 of the same pattern shape that are present on the SEM image 901. Next, the user adjusts a position of the rectangle so that a defective portion 904 in a memory cell stays within the inspection region. The user performs a similar adjustment for a noise portion 905 in a memory cell to stay outside the inspection region. When the inspection region is displayed, the user will be able to confirm whether the inspection region is appropriate. Only the above mentioned inspection region will be inspected in GP inspection step S206.

Alternatively, defect discrimination criteria is automatically set up by using a generally known technique such as canonical analysis, based on pixel data relating to the inspection region in which the user teaches whether the image is normal image 907 or includes a defect 908 or noise 909.

Sixth Modification

The defect to be detected in the above modification has been the difference in the brightness of the specified inspection region. The brightness level of the defect to be detected, however, may also vary from region to region. If the inspection image and the reference image are compared as they are, noise of an undesirable brightness level is likely to be detected as a defect candidate.

In the sixth modification, therefore, defect detection threshold data may be changed according to inspection region. This will suppress the detection of noise as a defect candidate.

A total process flow in the sixth modification of the present invention is the same as the above process flow shown in FIG. 2, but details of the process in discrimination criteria setting step S204 differs from that of the first embodiment.

Figure 10:
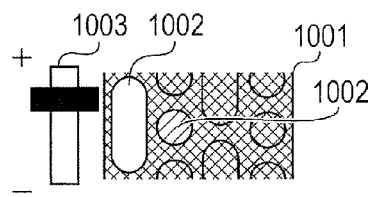
FIG. 10 is a diagram that represents a SEM image and an adjusting gauge, showing a further example of a concept of discrimination criteria setting in the first embodiment.

The concept of discrimination criteria setting according to the sixth modification is shown in FIG. 10. For example, displaying a threshold data map 1001 on the GUI screen 1121, clicking each of a plurality of inspection regions 1002 displayed on the GUI screen 1121, and then moving a defect detection threshold-level adjusting gauge 1003 displayed on the GUI screen 1121 to a threshold level to be specified. The user can repeat this procedure for each inspection region, to change the defect detection threshold data appropriately by the inspection region. In addition, although a modification that excludes irregular pattern regions from inspection has been shown and described above, the defect detection threshold levels relating to the irregular pattern regions may be changed to those of any other inspection region by changing the irregular pattern regions to the alternative inspection region, as is the case with the sixth modification in which FIG. 10 is referred.

The GP inspection in the present invention may be executed in combination with conventional cell-to-cell or die-to-die comparative inspection. During cell-to-cell comparative inspection, comparisons are conducted between the cyclic patterns on the memory mat provided on dies. During die-to-die comparative inspection, an image of one die is compared with an image of a die positioned in front or at rear of that die. Comparative die inspection, which is lower defect detection sensitivity than the cell-to-cell inspection, is commonly targeted for non-cyclic pattern regions to which cell-to-cell inspection cannot be applied. The GP inspection is expected to offer higher defect detection sensitivity than die-to-die comparative inspection. Accordingly, part or all of the non-cyclic regions for which the conventional die-to-die comparative inspection is targeted are desirably subjected to the GP inspection instead of the die-to-die comparative inspection. An example of a GUI for conducting the GP inspection is described below. In step S202 of specifying any region that includes memory cells, a wafer map screen is displayed when the user clicks a GP-creating tab 1102 on a GUI screen 1101 shown in FIG. 11. A chip layout 1105 with an array of dies 1104 arranged in grid form on the wafer is displayed on the wafer map 1103. When the user double-clicks on the GUI screen 1101 a die 1106 used for setting the region that includes memory cells, the wafer map changes to a die map 1201 shown in FIG. 12. When the user drags that region of the die map 1201 including the memory cells, the dragged region is displayed as a rectangular region 1202.

Next, when the user clicks an Acquire Image button 1203, the total device controller 114 controls the table 102 of the SEM 100 to move that section of the sample 103 which corresponds to the rectangular region 1202 specified on the GUI screen, to a position within an imaging field of the SEM 100. The SEM 100 then scans the sample 103 and acquires an image 1204 of the section corresponding to the rectangular region 1202. The acquired image 1204 is stored with position information.

Next, the acquired image 1204 is displayed. The user confirms the acquired image 1204 and then clicks a Register button 1205. The acquired image 1204 is then registered as a GP image.

Defect discrimination criteria is set up next. Here, the user may specify the inspection region 1209 on the acquired image 1204 by dragging. The user sets the defect detection threshold levels for the comparative inspection region 1209 by dragging the adjusting gauge 1206. The threshold data map 1210 of the thus-specified threshold levels will then be displayed on the GUI screen.

Next upon the user clicking an Inspect tab 1207 on the GUI screen, the process changes to the inspection process. After this, upon the user clicking an Inspect button 1301 shown in FIG. 13, images, such as an image 1302, of the wafer to be inspected are displayed in order and stored with position information. During the comparative inspection of each stored image, a defect candidate 1303 is detected, then a defect is extracted, and results are displayed on the wafer map 1103.

Second Embodiment

An embodiment that applies the present invention to a SEM-aided defect-reviewing device is described below. This defect-reviewing device uses position information relating to defects detected by an external inspection device, acquiring SEM images of the detected defects and reviewing and classifying the defects. The defect-reviewing device is suitable for detecting defects present on, and reviewing the shapes of, the fine patterns for which the present invention is targeted.

In a conventional case, when reviewing defects by using a defect-reviewing device, a SEM image obtained by imaging a region that included a defect to be reviewed, and a SEM image obtained by imaging a region that did not include the defect to be reviewed have been compared, then a difference between the two SEM images has been extracted as the defect, and a corresponding image has been reviewed, and this sequence has been repeated for each defect that was to be reviewed.

An example of a configuration of the defect-reviewing device according to the present embodiment is shown in FIG.

14. The defect-reviewing device comprises a scanning electron beam microscope 1400, an A/D converter 1410, image-processing means 1411, a user interface unit 1412, storage means 1413, and a total device controller 1414.

The electron beam microscope 1400 includes a casing 1401, a table 1402 laterally movable inside the casing 1401, an electron beam source 1404 that emits an electron beam 1405, a deflector 1406 for deflecting the electron beam 1405 that has been emitted from the electron beam source 1404, electron lenses 1407 that control a focus position of the electron beam 1405, and a detector 1409 that detects secondary electrons 1408 emanated from a semiconductor wafer 1403 scanned by the emitted electron beam 1405 whose focus position has been controlled by the electron lenses 1407, the detection being synchronized with a deflection signal from the deflector 1406. The secondary electrons that the detector 1409 has detected are each converted into an electrical signal and then after being further converted into a digital image signal by the A/D converter 1410, input to the image-processing means 1411, in which the digital image signal then undergoes image processing. In the defect-reviewing device of the configuration described above, in accordance with the position information corresponding to the inspection region on the semiconductor wafer 1403 that has been stored in the storage means 1413 in advance, the total device controller 1414 drives the table 1402 so that the inspection region on the semiconductor wafer 1403 is positioned within a reviewing field of the detector 1409 of the SEM 1400. The total device controller 1414 next controls the electron beam microscope 1400 to acquire a position-matching pattern image inside the reviewing field and after comparing this pattern image with a previously registered position-matching pattern registration image, calculate the position of the inspection region. Next, the calculated position of the inspection region is imaged with the SEM 400, whereby an image of the inspection region is acquired. The image-processing means 1411 compares the acquired image with a previously registered GP image, thus extracting defects. Finally, feature quantities of the extracted defects on the image are extracted and these defects are classified according to previously established rules. Images of the extracted defects and classification results on the defects are displayed on a screen 1421 of the user interface unit 1412.

An example of an operational sequence for conducting the GP inspection using the above inspection device to detect defects by taking an image of the memory cells formed on the semiconductor wafer, as the inspection image, and comparing this inspection image with a GP image, is substantially the same as in FIG. 2. The description of the first embodiment and its modifications in FIGS. 3 to 10 applied to the SEM-aided inspection device can also be applied to the SEM-aided defect-reviewing device.

Figure 11:
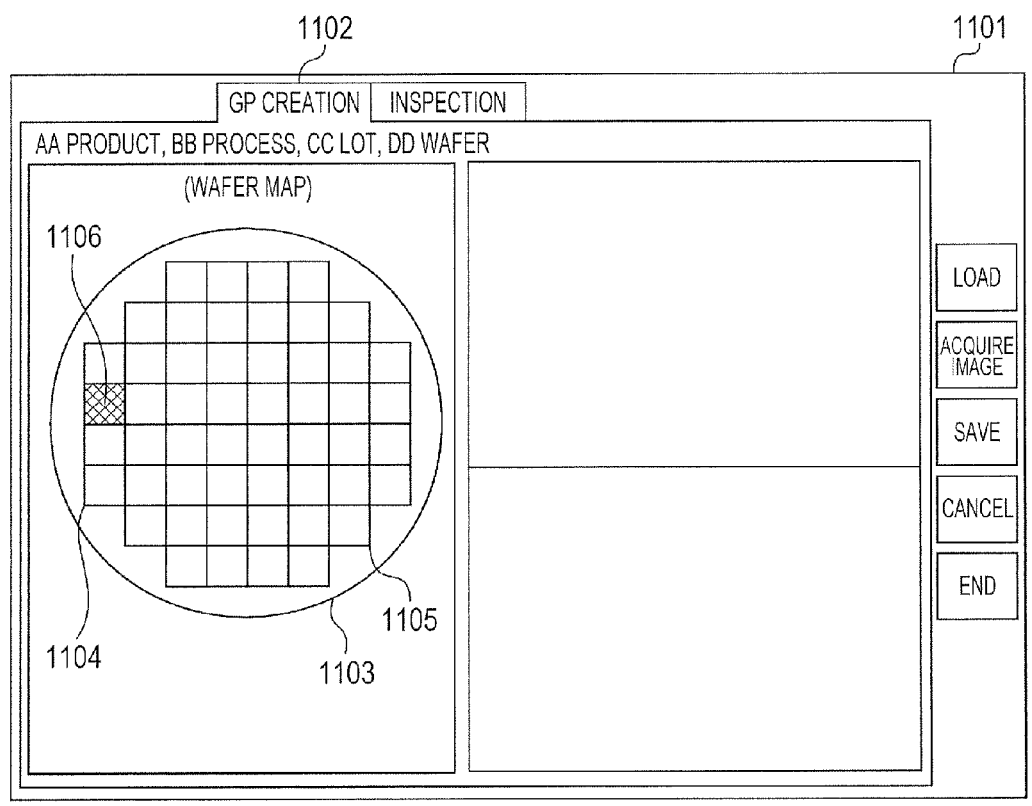
FIG. 11 is a front view of a display screen showing an example of a GUI intended for the GP inspection in the first embodiment.
Figure 12:
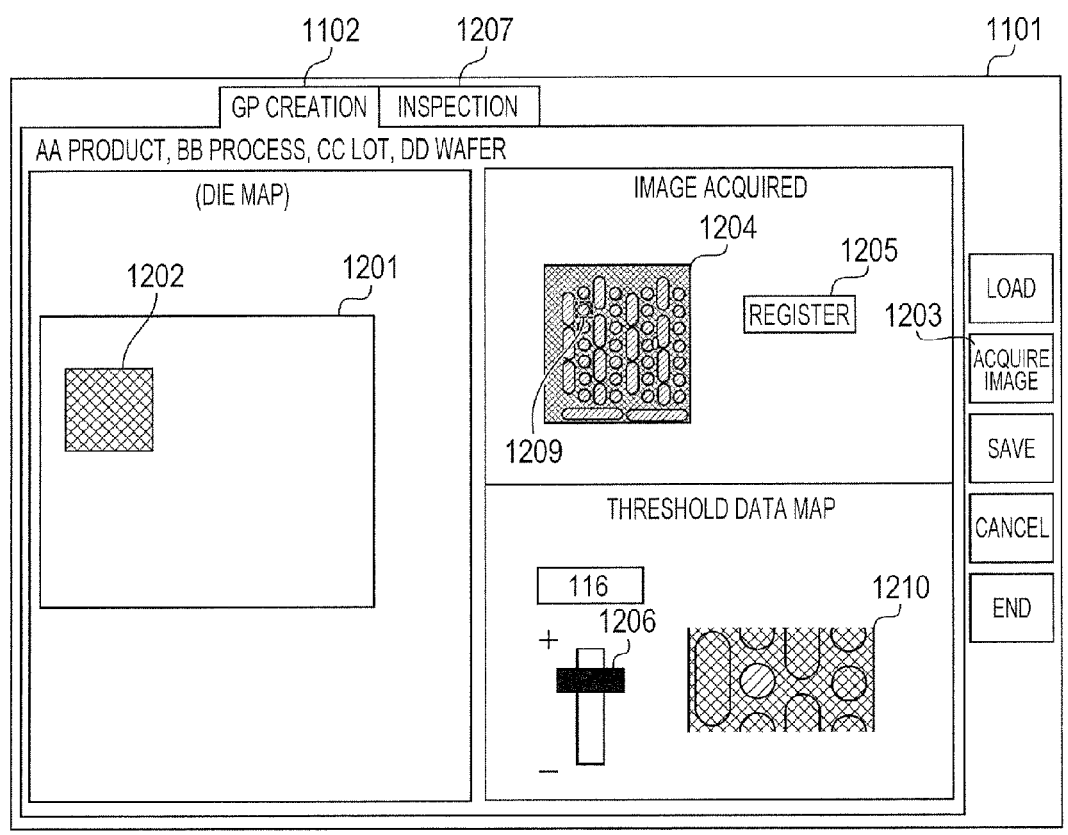
FIG. 12 is a front view of a display screen showing another example of a GUI intended for the GP inspection in the first embodiment.
Figure 13:
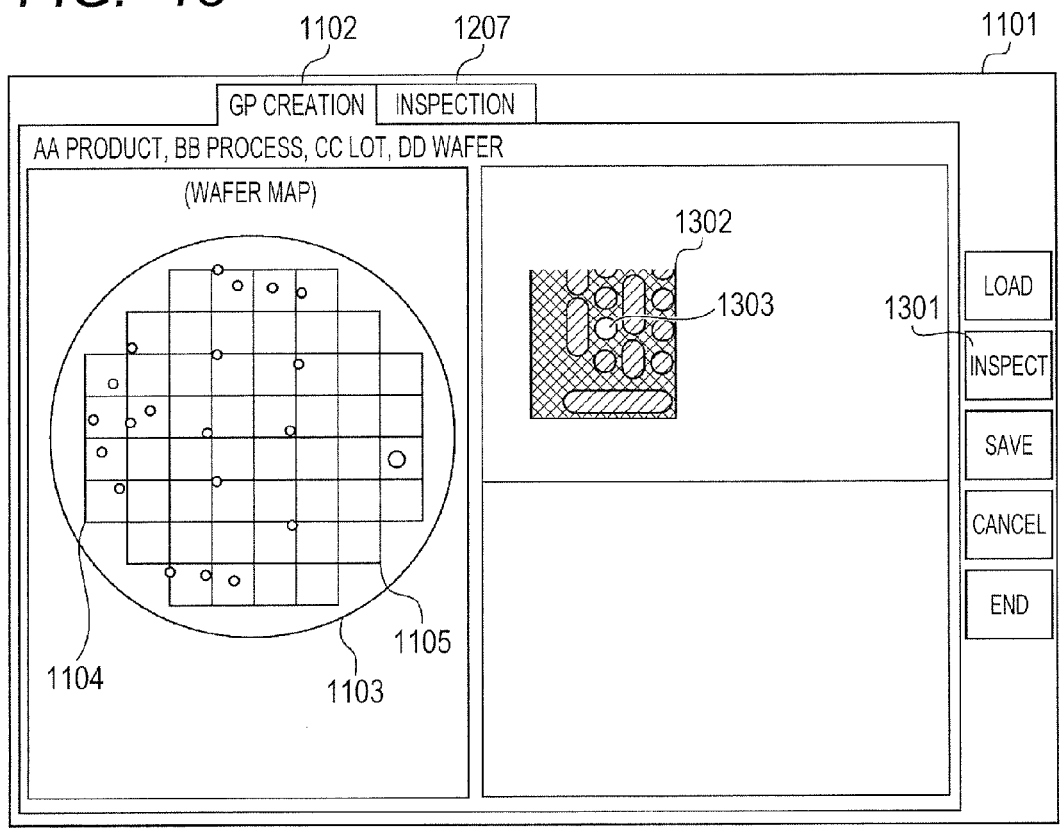
FIG. 13 is a front view of a display screen showing yet another example of a GUI intended for the GP inspection in the first embodiment.

A GUI for conducting the GP inspection in the present embodiment is substantially the same as the GUI described in the first embodiment using FIGS. 11 to 13.

Third Embodiment

Figure 14:
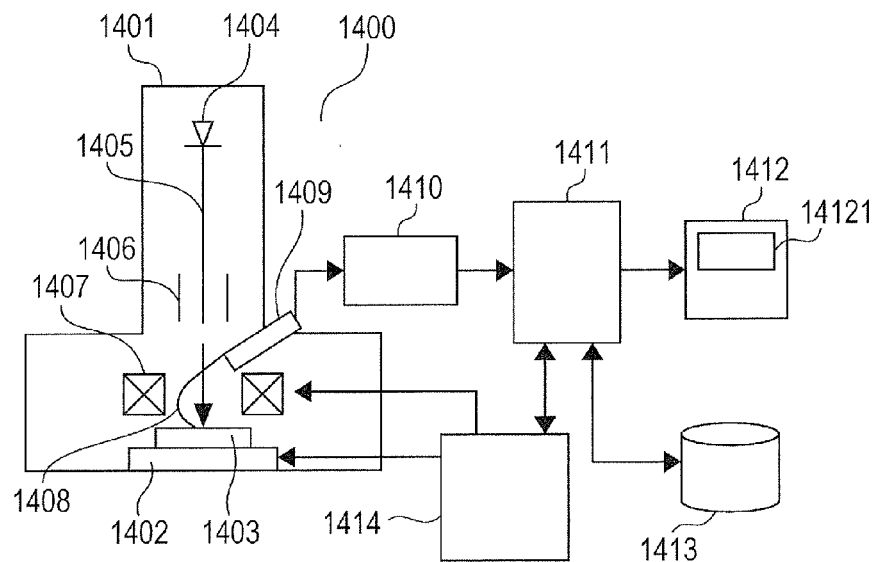
FIG. 14 is a block diagram showing a schematic configuration of a defect-reviewing device in a second embodiment.
Figure 15:
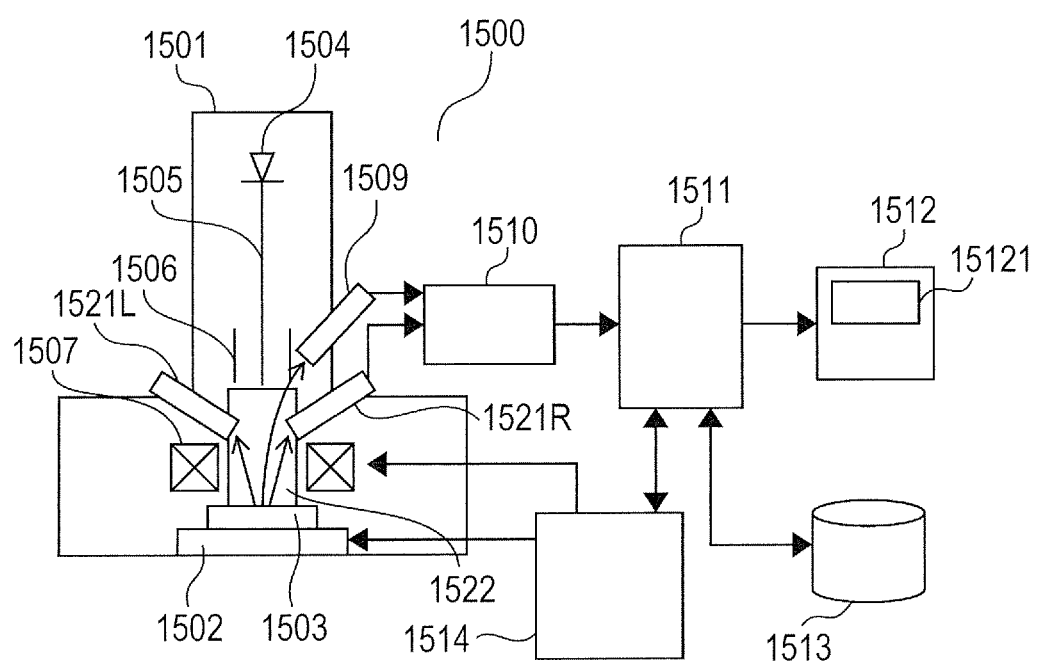
FIG. 15 is a block diagram showing a schematic configuration of a defect-reviewing device in a third embodiment.

Another example of a configuration of the defect-reviewing device according to a third embodiment is shown in FIG. 15. The defect-reviewing device shown in FIG. 15 includes one pair of reflected-electron detectors, namely 1521L and 1521R, in addition to the constituent elements of the defect-reviewing device described in the second embodiment using FIG. 14. The reflected-electron detectors 1521L and 1521R, mounted in directions different from each other, are preferably mounted in point-symmetrical relation with respect to a position at which beams are irradiated. Hereinafter, these reflected-electron detectors are referred to as the left reflected-electron detector (reflected-electron detector L) and the right reflected-electron detector (reflected-electron detector R). While the device configuration with the two reflected-electron detectors, 1521L and 1521R, is shown by way of example in FIG. 15, this number can be reduced or increased.

The defect-reviewing device shown in FIG. 15 comprises a scanning electron beam microscope 1500, an A/D converter 1510, image-processing means 1511, a user interface unit 1512, storage means 1513, and a total device controller 1514.

The electron beam microscope 1500 includes a casing 1501, a table 1502 laterally movable inside the casing 1501, an electron beam source 1504 that emits an electron beam 1505, a deflector 1506 for deflecting the electron beam 1505 that has been emitted from the electron beam source 1504, electron lenses 1507 that control a focus position of the electron beam 1505, a detector 1509 that detects secondary electrons 1508 emanated from a semiconductor wafer 1503 scanned by the emitted electron beam 1405 with the focus position controlled by the electron lenses 1507, the detection being synchronized with a deflection signal from the deflector 1506, and one pair of reflected-electron detectors, 1521L and 1521R, that detect electrons reflected from the semiconductor wafer 1503 scanned by the emitted electron beam 1505. The secondary electrons that the detector 1509 has detected, and the reflected electrons that the reflected-electron detectors 1521L and 1521R have detected are each converted into an electrical signal and then converted into a digital image signal by the A/D converter 1510. The digital image signal is input to the image-processing means 1511, and then undergoes image processing.

In the defect-reviewing device of the configuration described above, in accordance with the position information corresponding to the inspection region on the semiconductor wafer 1503 that has been stored in the storage means 1513 in advance, the total device controller 1514 drives the table 1502 so that the inspection region on the semiconductor wafer 1503 is positioned within a reviewing field of the detector 1509 of the SEM 1500. The total device controller 1514 next controls the electron beam microscope 1500 to acquire a position-matching pattern image inside the reviewing field and after comparing this pattern image with a previously registered position-matching pattern registration image, calculate the position of the inspection region. Next, the calculated position of the inspection region is imaged with the SEM 1500, whereby a reflected-electron image of the inspection region is acquired in addition to a secondary-electron image thereof. The image-processing means 1511 compares the acquired images with a previously registered GP image, thus extracting defects. Finally, feature quantities of the extracted defects on the image are extracted and these defects are classified according to previously established rules. Images of the extracted defects and classification results on the defects are displayed on a screen 15121 of the user interface unit 1512.

In this case, the GP image is desirably provided in association with each of the secondary-electron image and the reflected-electron image. In addition, the threshold data map described above is desirably provided in association with each of the secondary-electron image and the reflected-electron image.

An example of an operational sequence for conducting the GP inspection using the above-described device to detect defects by taking an image of the memory cells formed on the semiconductor wafer, as the inspection image, and comparing this inspection image with a GP image, is substantially the same as in FIG. 2. The description given using FIGS. 3-10 and the like can also be applied similarly to the description of the SEM-aided inspection device.

Figure 16:
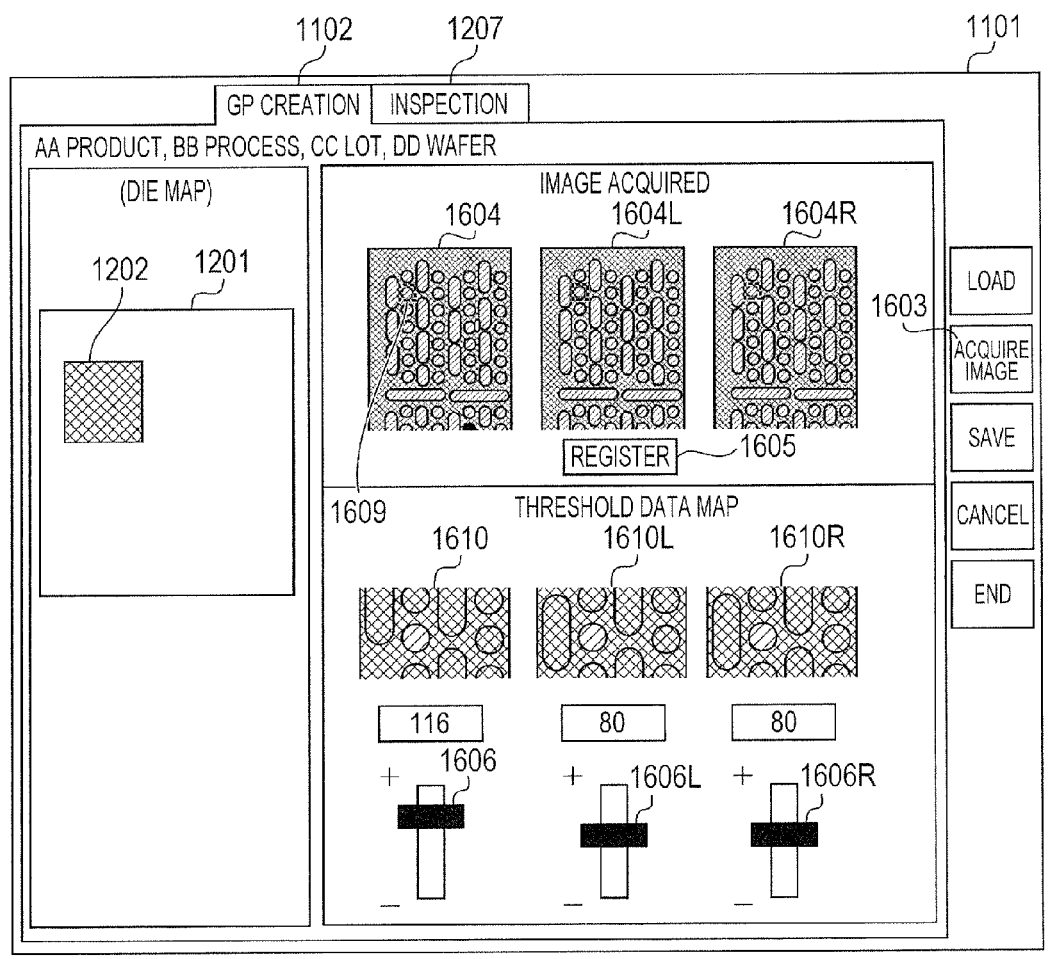
FIG. 16 is a front view of a display screen showing a further example of a GUI, the GUI screen being intended for GP inspection in the third embodiment.

A GUI for conducting the GP inspection is substantially the same as the GUI described in the first embodiment. The appropriate wafer map screen is displayed when the user clicks the GP-creating tab 1102 on the GUI screen 1101 shown in FIG. 11. The chip layout 1105 with an array of dies 1104 arranged in grid form on the wafer is displayed on the wafer map 1103. When the user double-clicks on the GUI screen 1101 the die 1106 used for setting the region that includes memory cells, the wafer map changes to a die map 1201 shown in FIG. 16. When the user drags that region of the die map 1201 including the memory cells, the dragged region is displayed as a rectangular region 1202.

Next, when the user clicks an Acquire Image button 1603, the total device controller 1514 controls the table 1502 of the SEM 1500 to move that section of the sample 1503 which corresponds to the rectangular region 1202 specified on the GUI screen, to a position within an imaging field of the SEM 1500. The SEM 1500 then scans the sample 1503 and acquires images 1604L and 1604R, as well as an image 1604, of the section corresponding to the rectangular region 1202. The acquired images 1604, 1604L, and 1604R are stored with position information.

Next, the acquired images 1604, 1604L, and 1604R are displayed. The user confirms the acquired images 1604, 1604L, and 1604R, and then clicks a Register button 1605. The acquired images 1604, 1604L, and 1604R are then registered as GP images.

Defect discrimination criteria are set up next. Here, the user may specify the inspection region 1609 on the acquired image 1604 by dragging. Inspection regions 1609L and 1609R corresponding to the inspection region 1609 are displayed on the acquired images 1604L and 1604R, respectively. The user sets the defect detection threshold levels for the comparative inspection regions 1609, 1609L, and 1609R, by dragging respective adjusting gauges 1606, 1606L, and 1606R. Threshold data maps 1610, 1610L and 1610R of the thus-specified threshold levels will then be displayed on the GUI screen.

INDUSTRIAL APPLICABILITY

The present invention can be applied to semiconductor wafer inspection techniques, and more particularly, to devices for inspecting defects on patterns formed on a particular semiconductor wafer.

DESCRIPTION OF REFERENCE NUMBERS

100 . . . Scanning electron microscope
101 . . . Casing
102 . . . Table
103 . . . Semiconductor wafer
104 . . . Electron beam source
105 . . . Electron beam
106 . . . Deflector
107 . . . Electron lens
110 . . . A/D converter
111 . . . Processing means
112 . . . User interface unit
113 . . . Storage means
114 . . . Total device controller
502 . . . Adjusting gauge
802 . . . Memory cell
901 . . . GUI screen
902 . . . GP-creating tab
903 . . . Wafer map
904 . . . Die
905 . . . Chip layout
1001 . . . Die map
1005 . . . Register button
1006 . . . Adjusting gauge
1006L . . . Adjusting gauge L
1006R . . . Adjusting gauge R
1007 . . . Inspect tab
1008 . . . Inspect button
1009 . . . Inspection region
1009L . . . Inspection region L
1009R . . . Inspection region R
1101 . . . Inspect button
1121 . . . GUI screen
1203 . . . Adjusting gauge
1501 . . . Reflected-electron detector
1501L . . . Reflected-electron detector
1501R . . . Reflected-electron detector
1701 . . . Electron beam source
1702 . . . Electron beam
1703 . . . Deflector
1704 . . . Objective lens
1705 . . . Semiconductor wafer
1706 . . . Stage
1708 . . . Detector
1709 . . . A/D converter
1710 . . . Image-processing circuit
1711 . . . Detection conditions control unit
1712 . . . Image-processing control unit
1713 . . . Total device controller
1714 . . . Data storage unit
1715 . . . User interface unit

The invention claimed is:

1. A method for inspecting defects on a sample surface using an image acquired with a scanning electron microscope (SEM), the method comprising the steps of:
    creating a teaching image from the SEM-acquired image;
    setting defect discrimination criteria on a screen;
    acquiring an inspection image using the SEM, wherein the inspection image acquired using the SEM relates to at least one of: a region specified on the screen, based on the teaching image, and a region having formed therein a pattern of the same shape as that of the region specified on the screen;
    conducting a comparative inspection between the obtained teaching image and inspection image using the screen-set defect discrimination criteria; and
    displaying results of the comparative inspection.

2. The defect inspection method according to claim 1, wherein, in the step of creating the teaching image, the SEM images an onscreen-specified region on the sample to be inspected, and creates the teaching image using an image obtained by the imaging.

3. The defect inspection method according to claim 1, wherein, in the step of creating the teaching image, the SEM images an onscreen-specified region on the sample to be inspected, and creates the teaching image using an image obtained by averaging a plurality of images obtained by the imaging.

4. The defect inspection method according to claim 1, wherein, in the step of setting the defect discrimination criteria, the defect discrimination criteria is set on a screen having the teaching image displayed thereupon.

5. A method for inspecting defects on a sample surface using an image acquired with a scanning electron microscope (SEM), the method comprising the steps of:

creating a teaching image from the SEM-acquired image;
setting defect discrimination criteria on a screen;
acquiring an inspection image using the SEM;
conducting a comparative inspection between the obtained teaching image and inspection image using the screen-set defect discrimination criteria; and
displaying results of the comparative inspection;
wherein, in the step of acquiring the inspection image using the SEM, at least one of the following is excluded: a region specified on the screen, based on the teaching image, and a region having formed therein a pattern of the same shape as that of the region specified on the screen.

6. A defect inspection device comprising:
a scanning electron microscope (SEM) unit configured to acquire an image of a sample by imaging the sample;
a display unit including a screen configured to display the sample image acquired using the SEM unit;
a teaching image creating unit configured to create a teaching image from the sample image displayed on the display unit;
a defect discrimination criteria setting unit configured to create, on the display unit displaying the teaching image created by the teaching image creating unit, criteria for discriminating defects on the sample image acquired using the SEM unit;
a defect detection unit configured to detect defects on the sample by implementing, by use of the defect discrimination criteria set up using the defect discrimination criteria setting unit, a comparative inspection of the image acquired during the imaging of the sample using the SEM unit, with respect to the teaching image created by the teaching image creating unit;
an output unit configured to transmit results of the sample defect detection with the defect detection unit; and
a control unit configured to control the SEM unit, the display unit, the teaching image creating unit, the defect discrimination criteria setting unit, the defect detection unit, and the output unit, wherein the control unit is configured to control the SEM unit to acquire an inspection image of at least one of: a region specified on the screen of the display unit, based on the teaching image, and a region having formed therein a pattern of the same shape as that of the region specified on the screen of the display unit.

7. The defect inspection device according to claim 6,
wherein the teaching image creating unit is configured to create the teaching image from an image obtained by the SEM-imaging of a region on the sample to be inspected, the region being specified on the screen of the display unit.

8. The defect inspection device according to claim 6,
wherein the teaching image creating unit is configured to create the teaching image from an image obtained by averaging a plurality of images obtained by the SEM-imaging of a region on the sample to be inspected, the region being specified on the screen of the display unit.

9. The defect inspection device according to claim 6,
wherein the defect discrimination criteria setting unit is configured to set the defect discrimination criteria on the screen of the display unit having thereupon the teaching image created by the teaching image creating unit.

10. The defect inspection device according to claim 6,
wherein, when the control unit controls the SEM unit to acquire an inspection image, the control unit excludes, from the image acquisition, at least one of a region specified on the screen of the display unit, and a region having formed therein a pattern of the same shape as that of the region specified on the screen of the display unit.

* * * * *